United States Patent [19]

Gay

[11] 3,783,400

[45] Jan. 1, 1974

[54] DIFFERENTIAL CURRENT AMPLIFIER

[75] Inventor: Michael J. Gay, Scottsdale, Ariz.

[73] Assignee: Motorola, Inc., Franklin Park, Ill.

[22] Filed: Dec. 1, 1972

[21] Appl. No.: 311,405

Related U.S. Application Data

[63] Continuation of Ser. No. 149,466, June 3, 1971, abandoned.

[52] U.S. Cl. .................. 330/30 D, 307/299, 330/17, 330/28, 330/69

[51] Int. Cl. .................................................. H03f 3/68

[58] Field of Search .................... 307/299 A, 17, 28; 330/30 D, 69

[56] References Cited

UNITED STATES PATENTS

| | | | |
|---|---|---|---|
| 3,536,962 | 10/1970 | Iverson | 330/28 X |
| 3,673,508 | 6/1972 | Callahan, Jr. | 330/17 X |

*Primary Examiner*—Roy Lake
*Assistant Examiner*—Lawrence J. Dahl
*Attorney*—La Valle D. Ptak

[57] ABSTRACT

A differential current amplifier suitable for realization in monolithic integrated circuit form includes a pair of input transistors supplied with differential current at the bases thereof. The emitters of the transistors are interconnected, as are the collectors, and feedback resistors are connected between the collectors and the bases of the respective transistors. A pair of output transistors have the bases coupled in common with the bases of the input transistors and the emitters connected in common with the emitters of the input transistors, so that the collectors of the output transistors then provide a differential output current in accordance with differential input current supplied to the bases of the input transistors.

9 Claims, 2 Drawing Figures

INVENTOR
MICHAEL J. GAY
BY
Mueller & Aichele
ATTYS.

DIFFERENTIAL CURRENT AMPLIFIER

This is a continuation division, of application Ser. No. 149,466, filed June 3, 1971 now abandoned.

BACKGROUND OF THE INVENTION

In monolithic integrated circuit applications, differential amplifiers are commonly employed to provide differential output currents representative of differential input signals applied to the amplifiers. It often is necessary to cascade two or more stages to obtain the desired gain from the amplifiers, but a disadvantage which exists in such multiple stage differential amplifiers is that it usually is necessary to employ a separate current source for each of the differential amplifiers. Thus, the voltage requirements of the circuit are increased by a factor dependent upon the voltage drop across the current source and biasing for each current source must be provided. Therefore, a differential current amplifier capable of operating without the heretofore required current source and therefore capable of operating with lower voltage requirements in an integrated circuit is desirable.

SUMMARY OF THE INVNETION

It is an object of this invention to provide an improved current amplifier.

It is an additional object of this invention to provide an improved monolithic integrated amplifier circuit.

It is a further object of this invention to provide a differential current amplifier not requiring an additional current source.

In accordance with a preferred embodiment of this invention, a current amplifier includes at least three transistors. The emitters of all of the transistors are connected to a voltage supply terminal, and two of the transistors comprising the input transistors have their collectors connected together in common. The collectors of each of these input transistors also is connected through a resistor to its base, wtih the junctions of the resistors with the bases of the corresponding transistors comprising the inputs for differential input currents applied to the circuit. The base of the third or output transistors is connected to one of these junctions and the collector of the third transistor provides an amplified current representative of the input current applied to the common input junction. If two output transistors are provided, the base of the second output transistor is connected to the other input terminal; and the collector currents of the output transistors represent an amplified differential current, with the differential gain of the system being dependent upon the values of the resistors connected between the collectors and bases of the input transistors.

DETAILED DESCRIPTION

Figure 1:
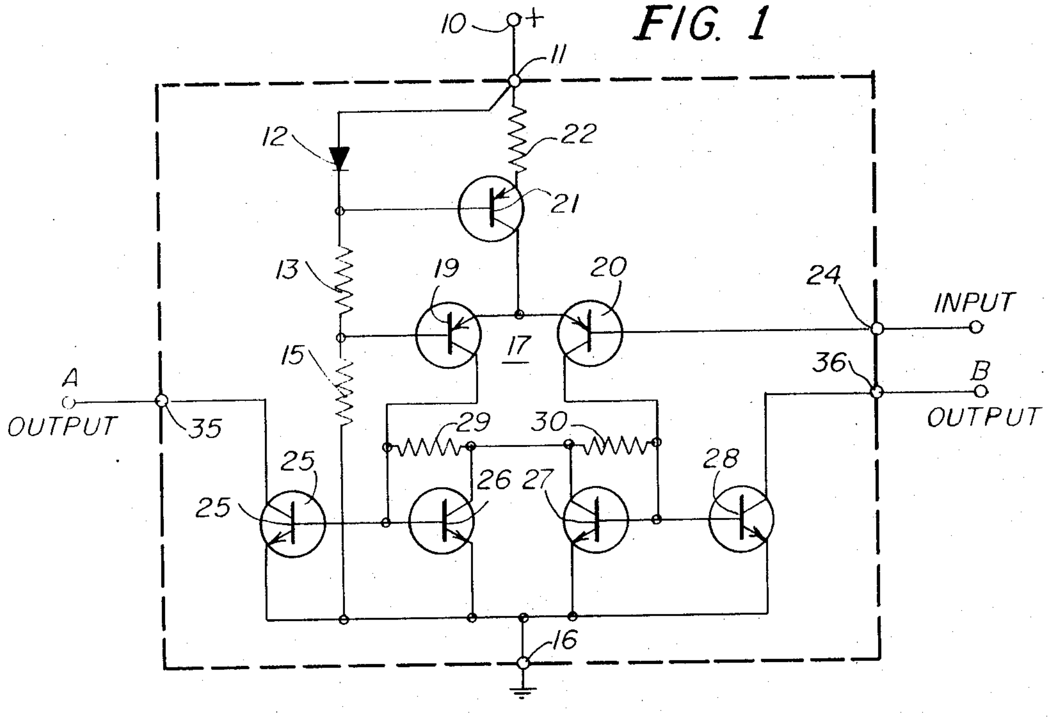
FIG. 1 is a schematic diagram of a preferred embodiment of the invention.
Figure 2:
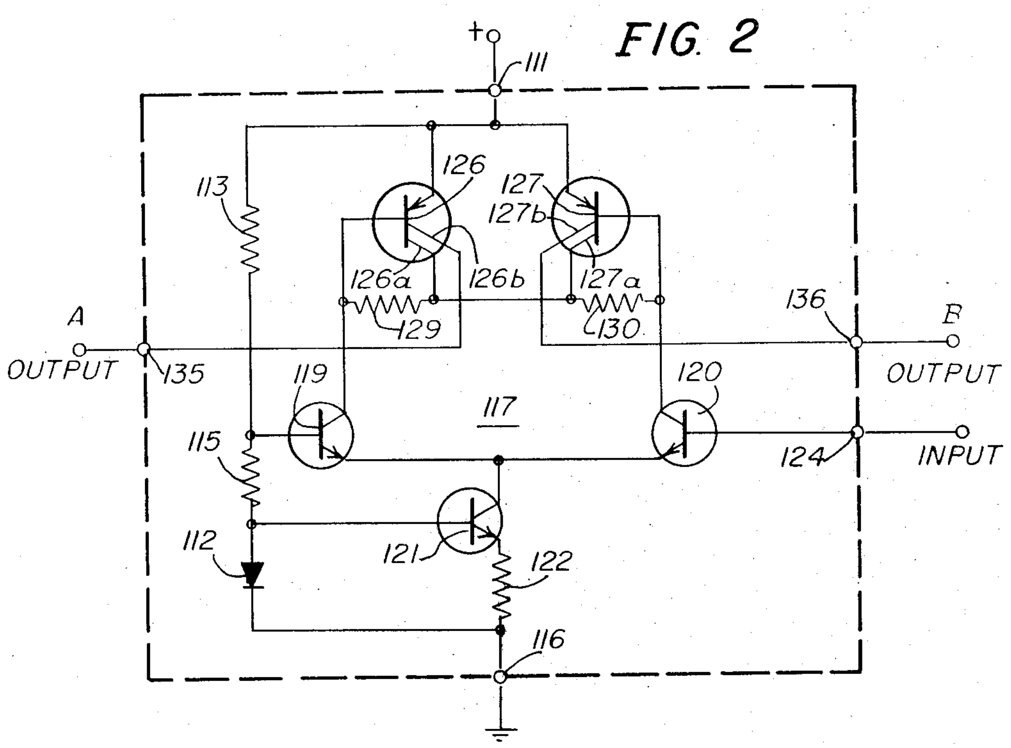
FIG. 2 is a schematic diagram of another preferred embodiment of the invention.

Referring now to the drawing, the portions of the circuit which may be incorporated in monolithic integrated circuit form are indicated in FIGS. 1 and 2 as being enclosed in dotted lines. The circuit components enclosed in the dotted lines may be fabricated as independent integrated circuit chips or may constitute portions of larger chips involving other circuit components and functions.

Referring now to FIG. 1, operating DC potential (B+) is applied to a terminal 10, which in turn is coupled to a bonding pad 11 on the integrated circuit chip. A voltage divider, including a diode 12 and a pair of resistors 13 and 15, is connected between the bonding pad 11 and a grounded bonding pad 16 to provide the operating bias potentials for the circuit. The current amplifier includes an input differential amplifier 17 comprised of a pair of lateral PNP transistors 19 and 20, the emitters of which are connected to the collector of a lateral PNP current source transistor 21 which supplies constant operating current to the differential amplifier 17. The emitter of the current source transistor 21 is connected through an emitter resistor 22 to the bonding pad 11 and the base of the transistor 21 is connected to the junction between the diode 12 and the resistor 13; so that the diode 12 provides an operating bias potential and temperature compensation for the current source transistor 21.

The base of the transistor 19 is provided with a reference potential obtained from the junction between the resistors 13 and 15, and input signals are applied to the base of the transistor 20 on a bonding pad 24; so that the relative conduction of the transistors 19 and 20 is dependent upon the relative magnitudes of the potentials applied to the bases of these transistors. When the input potential on the bonding pad 24 is equal to the potential on the base of the transistor 19, the transistors 19 and 20 are equally conductive and divide equally the current supplied by the current source 21. When the potential applied to the input bonding pad 24 is more positive than the reference potential on the base of the transistor 19, the transistor 19 conducts more current than the transistor 20, and vice-versa.

In order to obtain additional gain for the differential currents which appear on the collectors of the transistors 19 and 20, an output stage consisting of four NPN transistors 25, 26, 27 and 28 is provided. The collector of the transistor 19 is connected in common to the bases of the transistors 25 and 26 and also through a resistor 29 to the collector of the transistor 26. Similarly, the collector of the transistor 20 is connected in common to the bases of the transistors 27 and 28 and through a resistor 30 to the collector of the transistors 27, and the resistors 29 and 30 are selected to be of equal value.

The emitters of all of the transistors 25, 26, 27 and 28 are connected in common to the grounded bonding pad 16; and to maintain a differential operation of the output stage, the collectors of the transistors 26 and 27 are interconnected. Thus, the resistors 29 and 30 effectively are connected across the collectors of the transistors 19 and 20, with the junction between the transistors 29 and 30 being connected in common to the collectors of the transistors 26 and 27. This interconnection of the resistors 29 and 30 with the transistors 26 and 27 provides a feedback circuit which causes the currents supplied by the transistors 19 and 20 to the transistors 26 and 27 to be constrained to floW into the collectors of the transistors 26 and 27. Thus, if the input currents appearing on the collectors of the transistors 19 and 20 are different, a differential voltage is developed across the resistors 29 and 30 and appears between the bases of the transistors 26 and 27. This differential voltage causes the current flowing in the transistors 26 and 27 to differ. For small differential currents appearing on the collectors of the transistors 19 and 20, the differential current $\Delta i_d$ between the transistors 26 and 27 is given by the following equation (assuming the transistors 26 and 27 are matched):

$$\Delta i_d = \Delta i_i \, [(\Sigma i_i \, R)/4(KT/q)] \quad (1)$$

where R is the sum of the resistance of resistors 29 and 30;

$\Delta i_i$ is the input differential current obtained from the collectors of the transistors 19 and 20;

$\Sigma i_i$ is the sum of the input currents; and $K$, $T$ and $q$ have their usual meanings.

If the transistors 24 and 28 are selected to match the transistors 26 and 27 respectively, then the differential output current $i_o$ equals the differential current between the transistors 26 and 27:

$$\Delta i_o = \Delta i_i \, [\Sigma i_i \, R/4(KT/q)] \quad (2)$$

thus, the differential gain of this system is:

$$\Sigma i_i \, R/4(KT/q) \quad (3)$$

The output currents on the collectors of the transistors 25 and 28 are applied to a pair of output bonding pads 35 and 36 as output currents on a pair of output terminals A and B, respectively. The absolute magnitudes of these output currents and the differential component between these currents may be scaled higher or lower by varying the relative emitter areas of the transistors 25 and 26 and of the transistors 28 and 27. From an examination of FIG. 1, it can be seen that the input currents applied to the output stage 25, 26, 27, 28 from the collectors of the transistors 19 and 20 both are dropped across a diode junction in the form of the emitter-base junction of the transistors 26 and 27, respectively, so that the voltage required to operate the portion of the circuit connected to the collectors of the transistors 19 and 20 is approximately 0.7 volts (1 $\phi$).

The interconnection of the collectors of the transistors 26 and 27 in the circuit including the feedback resistors 29 and 30 causes the output stage including the transistors 25 to 28 to provide increased differential current gain even though an additional output current source is not provided for the emitters of the transistors 26 and 27. By eliminating this additional current source which normally is used for an additional cascaded stage of a multistage differential current amplifier, it is possible to operate the circuit across a lower potential than is possible if such an additional current source is used.

Although the circuit shown in FIG. 1 has a unity common mode gain for the output stage 25 to 28, a substantially increased differential gain is provided by the use of the feedback resistors 29 and 30; so that the disadvantages of the loss of common mode rejection in the output stage are substantially offset by the advantages of the differential gain obtained without the necessity for an additional current source.

Referring now to FIG. 2, there is shown another variation of the circuit shown in FIG. 1 but utilizing a PNP transistor output stage which is implemented on a monolithic integrated circuit by the use of two dual-collector lateral PNP transistors. From an examination of FIG. 1, it can be seen that the bases of the transistors 25 and 26 and the emitters thereof both are coupled to common terminals, as are the comparable electrodes of the transistors 27 and 28, with only the collector electrodes of these four of FIG. 1 being connected to different points in the circuit. Thus, it is possible to implement the circuit shown in FIG. 1 by the use of dual-collector transistors which may be either NPN transistors or PNP transistors as shown in FIG. 2.

The circuit shown in FIG. 2 operates in substantially the same manner as the circuit shown in FIG. 1, except that the input differential amplifier 117 is in the form of a pair of NPN transistors 119 and 120 which are supplied with current from a current source transistor 121, the emitter of which is connected to a grounded bonding pad 116 through an emitter resistor 122. Input signals are applied to the base of the transistor 120 on a bonding pad 124; and the biasing potentials for providing the DC reference levels for the operation of the circuit are obtained from a voltage divider in the form of a pair of resistors 113 and 115 connected in series with a diode 112 between a B+ input bonding pad 111 and the grounded bonding pad 116. The operation of this portion of the circuit is the same as the operation of the circuit shown in FIG. 1.

The output transistor stages of FIG. 2 comprise a pair of lateral PNP dual-collector transistor 126 and 127, respectively, with the base of the transistor 126 receiving current from the collector of the transistor 119 and the base of the transistor 126 receiving current from the collector of the transistor 120. The first collector **126*a* of the transistor 126 is interconnected with its base through a feedback resistor 129. A comparable collector 127*a* of the transistor 127 is interconnected with its base through a feedback resistor 130. A second collector 126*b* of the transistor 126 supplies a first output current on an output bonding pad 135 and the second collector 127*b* of the transistor 127 supplies a second output current on an output bonding pad 136. These output currents supplied by the transistor collectors 126*b* and 127*b* are comparable to the currents supplied by the collectors of the transistors 25 and 28 of FIG. 1**.

By changing the relative areas of the collectors **126*a* and 126*b* and the relative areas of the collectors 127*a* and 127*b*, it is possible to vary the scaling factor between the input portions of the transistors 126 and 127 and the output portions in the same manner as an adjustment may be made with the four separate transistors shown in FIG. 1**.

If only a single one of the outputs A or B is desired, the additional collector connected to that output could be eliminated. The remainder of the circuit remains the same to provide a single output which is representative of the variations of differential current conducted by the transistors 119 and 120. The feedback circuit in the form of the resistors 129 and 130 operates in the same manner in FIG. 2, as the comparable feedback circuit including the resistors 29 and 30 in the circuit shown in FIG. 1.

I claim:

1. A current amplifier including in combination:

first and second voltage supply terminals for connection across a source of DC potential;

first and second transistor means of the same conductivity type, at least said first transistor means comprising two portions and having first and second collector electrodes, at least one base electrode and at least one collector electrode, at least one base electrode, and at least one emitter electrode, the second collector of said first transistor means and said one collector of said second transistor means being connected in common at a first junction, and the emitters of said first and second transistor means being connected with said first voltage supply terminal;

first resistive impedance feedback means connected between said first junction and said one base of said first transistor means;

second resistive impedance feedback means connected between said first junction and said one base of said second transistor means;

third and fourth transistor means of opposite conductivity type to the conductivity type of said first and second transistor means, said third and fourth transistor means each having collector, base and emitter electrodes, the collector of said third transistor means connected with said one base of said first transistor means, the collector of said fourth transistor means connected with said one base of said second transistor means, and the emitters of said third and fourth transistor means connected in common at a second junction;

means for supplying a differential input signal to the bases of said third and fourth transistor means; and a current source coupled between said second junction and said second voltage supply terminal, the first collector of said first transistor means providing output current from said amplifier circuit.

2. The combination according to claim 1 wherein said current amplifier is a monolithic integrated circuit and said first and second transistor means comprise lateral PNP transistors, with said first transistor means being fabricated as a dual-collector lateral PNP transistor, the common emitter thereof comprising said one emitter of said first transistor means, the common base thereof comprising said one base of said first transistor means, and having first and second collectors corresponding to the first and second collectors, respectively, of said first transistor means.

3. The combination according to claim 2 wherein said first and second resistive feedback impedance means comprise first and second resistors of equal value.

4. The combination according to claim 3 wherein said third and fourth transistor means comprise NPN transistors.

5. The combination according to claim 1 wherein said second transistor means comprises two portions and has said one collector thereof and a second collector thereof, the first collector of said first transistor means and the second collector of said second transistor means providing differential output current from said amplifier circuit.

6. The combination according to claim 5 wherein said first and second resistive impedance means include first and second resistors of equal value.

7. The combination according to claim 5 wherein at least said first transistor means comprises a dual-collector transistor, the common emitter thereof comprising said one emitter of said first transistor means, the common base thereof comprising said one base of said first transistor means, and the first and second collector electrodes of said first transistor means comprising first and second collectors, respectively, of said dual-collector transistor.

8. The combination according to claim 7 wherein said current amplifier is fabricated as a monolithic integrated circuit and said dual-collector transistor is a lateral PNP transistor.

9. The combination according to claim 8 wherein said second transistor means comprises a second dual collector lateral PNP transistor, the common emitter thereof comprising said one emitter of said second transistor means, the common base thereof comprising said one base of said second transistor means, and said one and second collector electrodes of said second transistor means comprising first and second collectors, respectively, of said second dual collector lateral PNP transistor.

* * * * *